(12) United States Patent
Mishima

(10) Patent No.: US 9,105,868 B2
(45) Date of Patent: Aug. 11, 2015

(54) ORGANIC EL ELEMENT INCLUDING A HOLE INJECTION LAYER WITH A PROPORTION OF SULPHUR ATOMS RELATIVE TO METAL ATOMS

(75) Inventor: Kosuke Mishima, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/123,253

(22) PCT Filed: Aug. 28, 2012

(86) PCT No.: PCT/JP2012/005404
§ 371 (c)(1),
(2), (4) Date: Dec. 2, 2013

(87) PCT Pub. No.: WO2013/183093
PCT Pub. Date: Dec. 12, 2013

(65) Prior Publication Data
US 2014/0312324 A1  Oct. 23, 2014

(30) Foreign Application Priority Data

Jun. 4, 2012 (JP) ................................. 2012-126955

(51) Int. Cl.
*H01L 29/08* (2006.01)
*H01L 35/24* (2006.01)
*H01L 51/00* (2006.01)
*H01L 51/52* (2006.01)
*H01L 51/50* (2006.01)
*H01L 27/32* (2006.01)

(52) U.S. Cl.
CPC ............ *H01L 51/5237* (2013.01); *H01L 27/32* (2013.01); *H01L 51/5088* (2013.01); *H01L 51/5092* (2013.01)

(58) Field of Classification Search
None
See application file for complete search history.

(56) References Cited

U.S. PATENT DOCUMENTS

| 6,456,003 | B1 | 9/2002 | Mori et al. |
| 8,059,328 | B1 * | 11/2011 | Kuo et al. ..................... 359/290 |
| 2003/0036620 | A1 * | 2/2003 | Kawanabe et al. ............. 528/44 |
| 2004/0249156 | A1 * | 12/2004 | Kim et al. .......................... 546/2 |
| 2006/0097632 | A1 | 5/2006 | Ryu |
| 2006/0257777 | A1 * | 11/2006 | Matsumura et al. ....... 430/109.4 |

(Continued)

FOREIGN PATENT DOCUMENTS

| JP | 2000-223278 | 8/2000 |
| JP | 2003-251732 | 9/2003 |

(Continued)

OTHER PUBLICATIONS

International Search Report (ISR) in International Patent Application No. PCT/JP2012/005404, dated Dec. 11, 2012.

*Primary Examiner* — Mamadou Diallo
*Assistant Examiner* — Jay C Chang
(74) *Attorney, Agent, or Firm* — Greenblum & Bernstein, P.L.C.

(57) ABSTRACT

An organic EL element has an anode and a cathode a light-emitting layer including an organic material provided between the anode and the cathode, a hole injection layer provided between the anode and the light-emitting layer, and a electron injection layer provided between the light-emitting layer and the cathode 7. The hole injection layer and the electron injection layer include metal atoms and sulphur atoms. The sulphur concentration in the hole injection layer and the electron injection layer is no less than 96 ppm and no more than 439 ppm in terms of numerical ratio of sulphur atoms to metal atoms in the hole injection layer.

16 Claims, 7 Drawing Sheets

(56) References Cited

U.S. PATENT DOCUMENTS

| | | |
|---|---|---|
| 2007/0029929 A1 | 2/2007 | Nakamura et al. |
| 2010/0102310 A1 | 4/2010 | Komatsu et al. |
| 2010/0109516 A1* | 5/2010 | Warashina et al. .......... 313/504 |
| 2012/0132934 A1 | 5/2012 | Ohuchi et al. |

FOREIGN PATENT DOCUMENTS

| | | |
|---|---|---|
| JP | 2005-353401 | 12/2005 |
| JP | 2006-135337 | 5/2006 |
| JP | 2007-073499 | 3/2007 |
| JP | 2010-103374 | 5/2010 |
| WO | 2011/161726 | 12/2011 |

* cited by examiner

ORGANIC EL ELEMENT INCLUDING A HOLE INJECTION LAYER WITH A PROPORTION OF SULPHUR ATOMS RELATIVE TO METAL ATOMS

TECHNICAL FIELD

The present invention pertains to an organic electro-luminescent element (hereinafter, organic EL element), specifically to technology for constraining the deterioration of a light-emitting layer therein, and to a manufacturing method for the organic EL element as well as a display panel, light-emitting device, and display device incorporating the organic EL element.

BACKGROUND ART

In recent years, research and development of various functional elements using organic semiconductors has advanced, including organic EL elements as a representative functional element. An organic EL element is a current-driven light-emitting element in which a functional layer that includes a light-emitting layer made of an organic material is provided between a pair of electrodes composed of an anode and a cathode. Then, when voltage is applied to the electrodes, holes injected into the functional layer from the anode and electrons similarly injected into the functional layer from the cathode are recombined, such that the organic EL element produces light through the organic material electroluminescence effect. Accordingly, the organic EL element is highly visible through auto-luminescence and is superbly resistant to shocks due to the complete individualisation of the element. As such, the organic EL element is attracting attention as a light source for use in various organic EL display panels and organic EL display devices.

As it happens, the organic EL element is prone to degradation of light-emitting properties and lifespan once water reaches the light-emitting layer and causes deterioration thereof In consideration of this problem, suggestions such as applying a getter solution to the periphery of the organic EL display panel have been proposed, as an approach to constraining the approach of water toward the light-emitting layer. Also, a suggestion of disposing a sealing member so as to cover a layered configuration of the organic EL element and thereby protect the light-emitting layer against approaching water has been proposed (see Patent Literature 1).

CITATION LIST

Patent Literature

[Patent Literature 1]
  Japanese Patent Application Publication No. 2007-73499

SUMMARY OF INVENTION

Technical Problem

In a conventional organic EL element as described above, infiltration by water reaching the light-emitting layer causes deterioration therein, and as such, reliable constraints of this phenomenon are desired.

In consideration of this problem, the present disclosure aims to provide a organic EL element in which the deterioration of the light-emitting layer due to infiltrating water is reliably constrained.

Solution to Problem

In order to achieve the above-stated aim, an organic electroluminescence element comprises: a first electrode and a second electrode; a light-emitting layer containing an organic material and provided between the first electrode and the second electrode; and a first functional layer provided between the first electrode and the light-emitting layer, wherein the first functional layer includes metal atoms and sulphur atoms, and the first functional layer has a sulphur concentration such that the proportion of the sulphur atoms relative to the metal atoms in the first functional layer is no less than 96 ppm and no more than 439 ppm.

Advantageous Effects of Invention

The organic EL element pertaining to an aspect of the present invention enables the deterioration of the light-emitting layer due to infiltrating water to be reliably constrained.

BRIEF DESCRIPTION OF DRAWINGS

FIG. 2A depicts formation of the anode over the substrate, FIG. 2B depicts formation of the hole injection layer over the anode, and FIG. 2C depicts forming the partition layer over the hole injection layer.

FIG. 3A depicts formation of the hole transport layer and the light-emitting layer over the hole injection layer and FIG. 3B depicts formation of the electron injection layer and the cathode over the light-emitting layer.

EMBODIMENTS

[Circumstances Leading to Embodiments]

Figure 1:
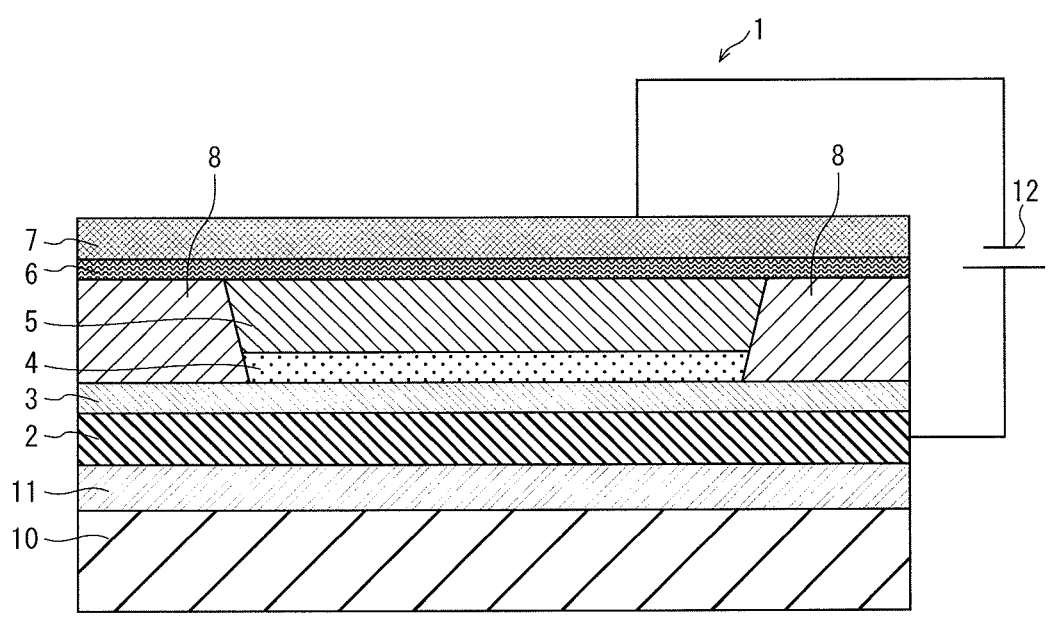
FIG. 1 is a schematic cross-sectional diagram illustrating the configuration of an organic EL element 1 pertaining to the Embodiment.

The following describes the circumstances leading to the production of the present disclosure, in advance of the specific Embodiment.

In recent years, organic EL elements have come to be widely applied to various display devices and light sources. Consequently, demand is rising for organic EL elements in which deterioration of the light-emitting properties and lifespan is controlled. In response, the inventors have addressed this demand by constraining the deterioration of the light-emitting layer caused by infiltrating water.

As a result of investigation, the inventors realised that not only water from the outside atmosphere but also water produced at locations near the light-emitting layer is at risk of reaching the light-emitting layer. Such locations include partitions, substrates, and planarizing layers, all made of organic materials. The inventors then considered using a functional layer that includes sulphur atoms in a configuration constraining the approach of water toward the light-emitting layer. As a result, the inventors found that forming the functional layer that includes sulphur atoms between the electrode and the light-emitting layer, an organic EL element is produced in which the approach of water toward the light-emitting layer from these locations is constrained, thereby preventing the deterioration of the light-emitting layer more reliably. The Embodiment of the present disclosure was reached in these circumstances.

The following describes an organic EL element as an Embodiment of the disclosure, followed by a description of experimental validation of the properties thereof. The dimensions of the components described in the drawings do not necessarily correspond to reality.

[Overview of Aspects]

In one aspect, an organic electroluminescence element, comprising: a first electrode and a second electrode; a light-emitting layer containing an organic material and provided between the first electrode and the second electrode; and a first functional layer provided between the first electrode and the light-emitting layer, wherein the first functional layer includes metal atoms and sulphur atoms, and the first functional layer has a sulphur concentration such that the proportion of the sulphur atoms relative to the metal atoms in the first functional layer is no less than 96 ppm and no more than 439 ppm.

Accordingly, the organic EL element is reliably protected from light-emitting layer deterioration caused by water.

In another aspect, an organic electroluminescence element further comprises a second functional layer provided between the second electrode and the light-emitting layer, wherein the second functional layer includes metal atoms and sulphur atoms, and the second functional layer has a sulphur concentration such that the proportion of the sulphur atoms to the metal atoms in the second functional layer is no less than 96 ppm and no more than 439 ppm.

In a further aspect, the first electrode is an anode, the second electrode is a cathode, the first functional layer includes the metal atoms as W in a metal oxide $WO_x$, and the second functional layer includes the metal atoms as Na in a metal fluoride NaF.

Also, the first functional layer has a greater sulphur concentration than the second functional layer.

Additionally, a planarizing layer made of a resin material is provided on an opposite side of the first electrode with respect to the first functional layer.

[Description of Embodiments]

(Embodiment 1)

1. Configuration (Organic EL Element)

The Embodiments of the present invention are described in detail below, with reference to the accompanying drawings. FIG. 1 is a schematic cross-sectional diagram illustrating the configuration of an organic EL element 1 pertaining to the present Embodiment. The organic EL element 1 described in the present Embodiment is a top-emission element in which light from a light-emitting layer is emitted from the far side of a glass plate. Specifically, the thickness of an aluminium (Al) cathode provided on the organic EL element 1 is minimised, such that the cathode is able to transmit the light. The organic EL element 1 may also, for example, be painted such that a wet process is applied to an organic functional layer. The cathode and an anode are connected to a direct current (hereinafter, DC) power source, and electric power is supplied to the organic EL element from an exterior source.

Specifically, as shown in FIG. 1, the organic EL element 1 is configured from a planarizing layer 11 formed over a principal surface of one side of a substrate 10, with the anode 2 serving as a first electrode, a hole injection layer 3 serving as a first functional layer, a hole transport layer 4, a light-emitting layer 5, an electron injection layer 6 serving as a second functional layer, and the cathode 7 serving as a second electrode, each layered thereon in the stated order. The light-emitting layer 5 and so on is formed between neighbouring partition layers 8. Also, as described above, the anode 2 and the cathode 7 are connected to a DC power source 12. Each of the layers is described in detail below.

(Substrate 10)

The substrate 10 is a base component for the organic EL element 1. The surface of the substrate 10 has a non-diagrammed thin-film transistor (hereinafter, TFT) formed thereon for driving the organic EL element 1. The substrate 10 is formed of non-alkali glass. However, no limitation is intended to the material used for the substrate 10. For example, an insulating material such as a soda glass, a non-fluorescent glass, a phosphoric glass, a boric gas, quartz, an acrylic resin, a styrene resin, a polycarbonate resin, an epoxy resin, a polyethylene resin, a polyester resin, a silicone resin, and aluminium oxide may also be used.

(Planarizing Layer 11)

The planarizing layer 11 is provided over the substrate 10 in order to planarize uneven portions of the surface of the substrate 10. The planarizing layer 11 is provided on the opposite side of the anode 2 with respect to the hole injection layer 3, and is formed of an acrylic resin. No limitation is intended to the material used for the planarizing layer 11. A resin material such as a styrene resin, a polycarbonate resin, an epoxy resin, and a silicone resin may also be used.

(Anode 2)

The anode 2 is formed over the TFT on the substrate 10. The anode 2 has a laminate structure of an aluminium alloy and indium tin oxide (hereinafter, ITO). The thickness of the anode 2 is, for example, 400 nm of the aluminium alloy and 15 nm of the ITO. No limitation is intended to the material used for the anode 2. For example, a laminate structure of a silver alloy and one of indium zinc oxide (hereinafter, IZO) and zinc oxide ($Z_nO$) may also be used.

(Hole Injection Layer 3)

The hole injection layer 3 is provided between the anode 2 and the light-emitting layer 5, and includes tungsten oxide ($WO_x$) and sulphur ions. In the formula of the tungsten oxide in the hole injection layer 3, the x of $WO_x$ is a real number satisfying $0.5<x<2$. No limitation is intended to the configuration of the tungsten oxide in the hole injection layer 3. Any configuration including a hole injection material may be used. Here, the hole injection material is a material in which holes are easily transferable from the anode 2 to the hole injection layer 3. Specifically, the hole injection material is such that, when the anode 2 and the hole injection layer 3 are in contact, an energy barrier between the Fermi level of the anode 2 and a lowest energy level in the valence band of the hole injection layer 3 is smaller than a predetermined value.

The sulphur density in the hole injection layer 3 is computed from a ratio of sulphur (S) atoms to tungsten (W) atoms, converted from the mass ratio of sulphur to tungsten. Also, the sulphur density is a concentration of no less than 96 ppm and no more than 439 ppm. The hole injection layer 3 has a thickness of 5 nm.

(Hole Transport Layer 4)

The hole transport layer 4 is made using TFB (poly(9,9-dioctyl-fluorene-co-N-(4-butylphenyl)-diphenylamine)) or the like. However, no such limitation is intended. The material for the hole transport layer 4 may be any type of material that includes polyfluorene, polyphenylene vinylene, a pendent, a dendrimer, or a coat of small molecules, that is soluble in a solvent, and that is applicable to forming a thin film.

Forming the hole transport layer 4 of organic molecules that are amines enables the holes conducted through the hole injection layer 3 to be more effectively inserted into the functional layer formed above the hole transport layer 4. In fact, the electron density in the highest occupied molecular orbital (hereinafter, HOMO) of the amines is distributed about the central pair of non-shared electrons on the nitrogen atom. As such, a corresponding amount of holes injection sites are made available. Accordingly, having the hole transport layer 4 include amines enables the formation of hole injection sites at the hole transport layer 4.

The hole transport layer 4 may be omitted from the configuration when the combination of layers between the anode 2 and the light-emitting layer 5 enables smooth transfer of holes from the anode 2 to the light-emitting layer 5.

(Light-Emitting Layer 5)

The light-emitting layer 5 is made of F8BT (poly(9,9-di-n-octylfluorene-alt-benzothiadiazole)), which is an organic macromolecule. However, the material for the light-emitting layer 5 is not limited to F8BT. Any known organic material may be used. For example, the material for the light-emitting layer 5 may be any of an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, and so on. The light-emitting layer 5 has a thickness of 70 nm, for examples.

(Electron Injection Layer 6)

The electron injection layer 6 includes sodium fluoride (NaF) and sulphur atoms. The sulphur concentration in the electron injection layer 6 is computed from a ratio of sulphur atoms to sodium atoms, converted from the mass ratio of sulphur to sodium. Also, the sulphur concentration is no less than 96 ppm and no more than 439 ppm. The electron injection layer 6 has a thickness of 5 nm, for example.

(Cathode 7)

The cathode 7 is made of aluminium. The cathode 7 has a thickness of 5 nm, for example.

(Partition Layers 8)

The partition layer 8 is made of a photoresist material, such as an acrylic resin. However, no limitation is intended. The material used for the partition layer 8 may be any insulating organic material, such as a polyimide resin, a novolac-type phenol resin, and so on.

2. Organic EL Element Manufacturing Method

The following describes a manufacturing method for the organic EL element 1.

FIGS. 2A-2C, 3A, and 3B are schematic cross-sectional diagrams illustrating the organic EL element 1 manufacturing method.

Figure 2A:
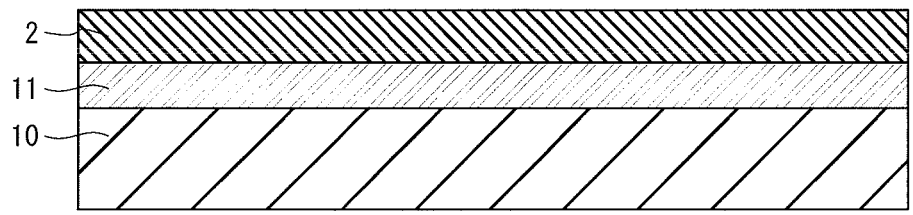
FIGS. 2A, 2B and 2C are schematic cross-sectional diagrams respectively illustrating steps of a manufacturing process for the organic EL element 1 illustrated in FIG. 1, where

First, as shown in FIG. 2A, the anode 2 made of an aluminium alloy and ITO is formed over the substrate 10, which has the planarizing layer 11 formed thereon. Specifically, the aluminium alloy and a film of the ITO are formed over the substrate 10 having the planarizing layer 11, by sputtering the target material thereon while introducing a reactive gas into the chamber.

A masque pattern is then formed over the ITO film in correspondence with the anode 2. Afterward, an etching solution is applied to the aluminium alloy and the ITO film on which the masque pattern is formed.

Figure 2B:
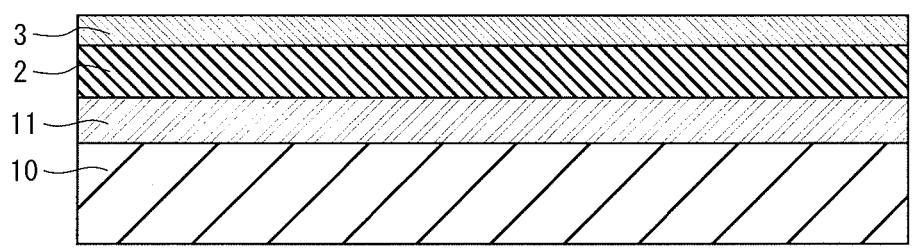

Next, as shown in FIG. 2B, the hole injection layer 3 that includes $WO_x$ is formed over the anode 2. The sputtering method is used to form the hole injection layer 3 because the metal used, namely tungsten, has a high melting point.

Figure 2C:
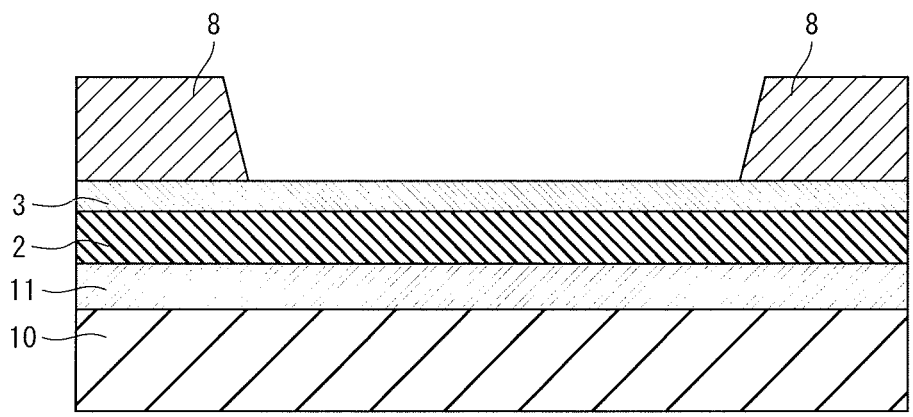

Further, as shown in FIG. 2C, the partition layer 8 is formed over the hole injection layer 3. Specifically, a layer of material for the partition layer 8 is first layered over the substrate 10, on which the hole injection layer 3 and the planarizing layer 11 have already been formed, using a spin coat method or the like. A masque is then formed over the layer of material for the partition layer 8. The masque is provided with apertures at locations where the partition layer 8 is to be formed. Patterning is then performed by using photolithography, resulting in the formation of the partition layer 8.

Figure 3A:
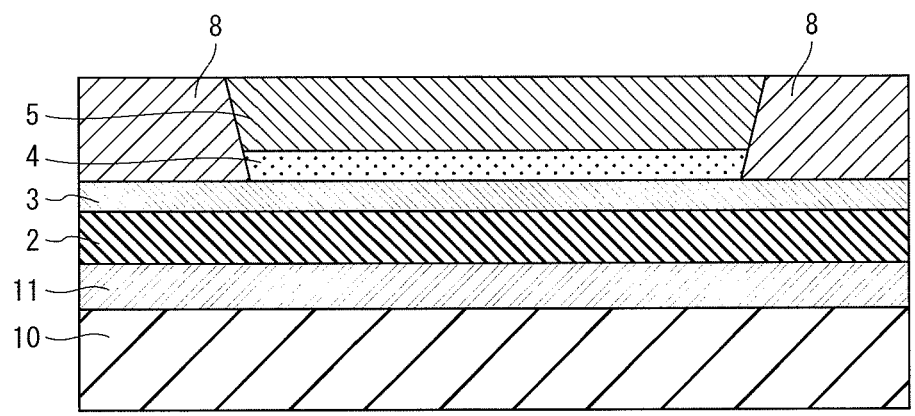
FIGS. 3A and 3B are schematic cross-sectional diagrams respectively illustrating steps of the manufacturing process for the organic EL element 1 illustrated in FIG. 1, where

Next, as shown in FIG. 3A, the hole transport layer 4 and the light-emitting layer 5 are formed in the stated order over the hole injection layer 3. Specifically, the hole transport layer 4 may be formed by, for example, by using an ink jet process or a wet process to drip an ink that includes organic material and a solvent in a pixel area 120 on the top face of the hole injection layer 3. The same process is used to form the light-emitting layer 5. No limitation is intended to the process used to form the hole injection layer 4 and the light-emitting layer 5. For example, any known method of dripping and applying ink may be used, such as spin coating, rotogravure printing, dispensing, nozzle coating, intaglio printing, relief printing, and so on.

Figure 3B:
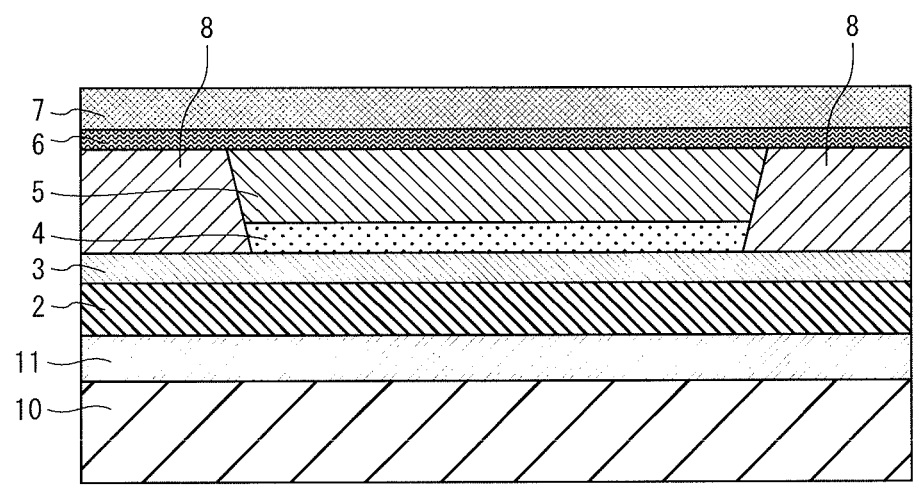

Finally, as shown in FIG. 3B, the electron injection layer 6 that contains sodium fluoride and the cathode 7 that contains aluminium are formed over the light-emitting layer 5, in the stated order. Given that sodium and aluminium have low melting points, either sputtering or vacuum deposition may be used for forming the electron injection layer 6 and the cathode 7.

The above-described steps result in the completion of the organic EL element 1.

3. Sulphur Atom Water Trap in Hole Injection Layer 3 and Electron Injection Layer 6

Through the effect of the sulphur atoms in the hole injection layer 3 and the electron injection layer 6 of the organic EL element 1, any entering water becomes trapped, thus preventing the water from reaching the light-emitting layer 5. Accordingly, the degradation of the light-emitting layer 5 is preventable. The water trapped by this configuration is likely produced in the planarizing layer 11 and the partition layer 8, made of acrylic resin. The following describes this configuration in detail.

Figure 4A:
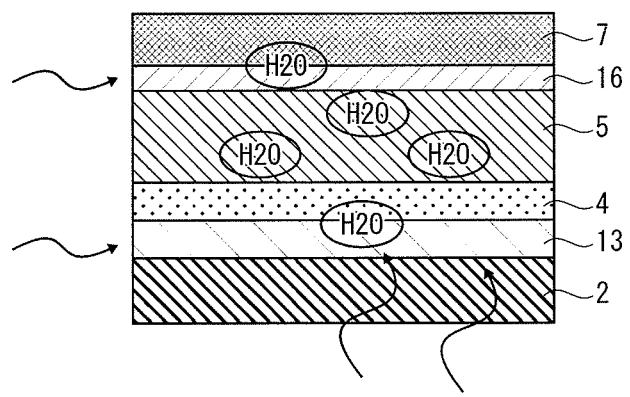
FIGS. 4A and 4B illustrate a water-trapping mechanism by sulphur, where FIG. 4A pertains to a comparative example while FIG. 4B pertains to the organic EL element illustrated in FIG. 1.
Figure 4B:
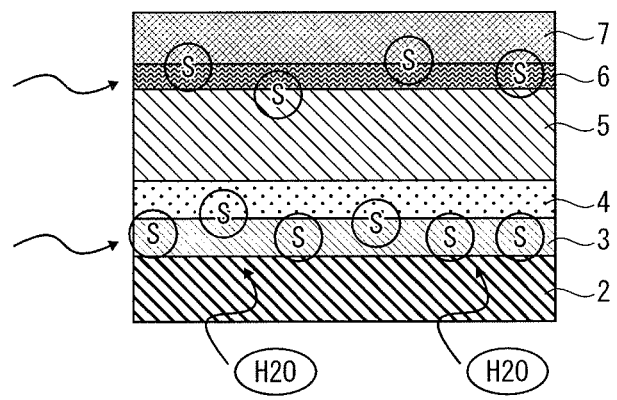

FIGS. 4A and 4B illustrate the mechanism by which the sulphur atoms in the hole injection layer 3 and the electron injection layer 6 act to trap water. FIG. 4A illustrates a comparative example while FIG. 4B illustrates the present Embodiment.

In the comparative example of FIG. 4A, the hole injection layer 13 and the electron injection layer 16 do not include any sulphur ions. Therefore, when water enters the hole injection layer 13 and the electron injection layer 16 from the planarizing layer 11 and the partition layer 8, no trap effect occurs at the hole injection layer 13 and the electron injection layer 16, leaving the water easily able to reach the light-emitting layer 5. Accordingly, the light-emitting layer 5 undergoes degradation.

In contrast, the present Embodiment shown in FIG. 4B has sulphur atoms present in the hole injection layer 3 and the electron injection layer 6. The sulphur concentration in the hole injection layer 3 is greater than the sulphur concentration in the electron injection layer 6.

As shown in FIG. 4B, when water enters the hole injection layer 3 and the electron injection layer 6 from the planarizing layer 11 and the partition layer 8, the sulphur atoms in the hole injection layer 3 and the electron injection layer 6 act as a trap to control the approach of water toward the light-emitting layer 5. As such, the approach of water toward the light-emitting layer 5 is constrained, enabling the degradation of the light-emitting layer 5 to be similarly constrained.

The mechanism by which the water is trapped by the sulphur atoms in the hole injection layer 3 and the electron injection layer 6 is believed to operate as follows. The sulphur atoms in the hole injection layer 3 and the electron injection layer 6 are, for example, present in sulpho groups ($SO_3$), sulphonyl groups ($SO_2$), thiol groups (SH), or similar. Here, water reaching the hole injection layer 3 and the electron injection layer 6 is trapped by means of attraction to the hydrophilic sulpho groups, sulphonyl groups, thiol groups, and so on. As such, the water and the functional groups that contain the sulphur atoms are attracted to each other, plausibly acting to trap the water in the hole injection layer 3 and the electron injection layer 6.

4. Experiment (Outline of Electron Injection Layer 6 Experiment)

Through experimental results, the degradation of the light-emitting layer 5 was found to be constrained by including sulphur atoms in the electron injection layer 6 within a fixed range of concentrations. The following describes this experiment in detail.

(Sulphur Density Lower Bound)

The water-trapping effect by the sulphur atoms is likely insufficient when the sulphur density in the electron injection layer 6 falls below a predetermined value. As such, there exists a lower bound of sulphur density.

Figure 5:
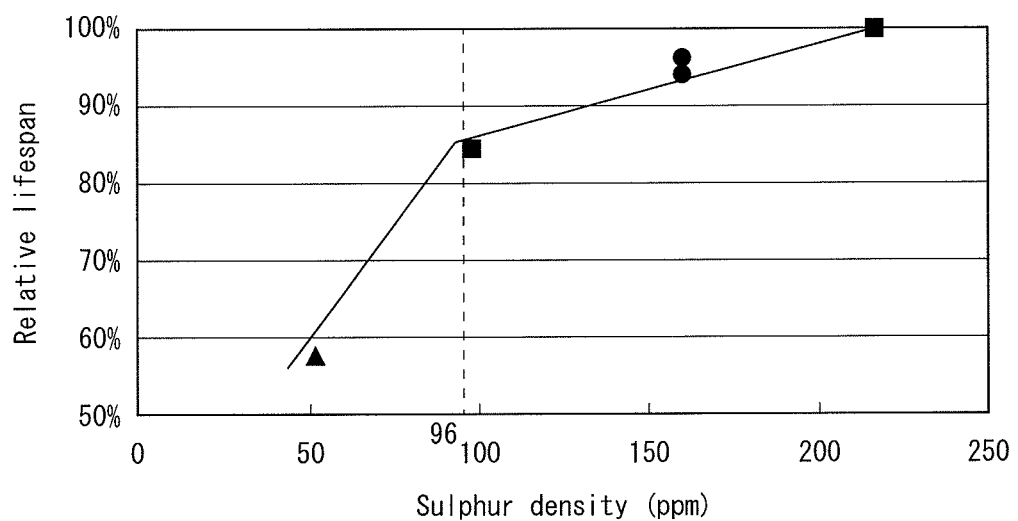
FIG. 5 is a graph representing the relationship between sulphur density and relative lifespan.

FIG. 5 indicates the relationship between the sulphur density and the relative lifespan of the electron injection layer 6. Here, the horizontal axis gives the sulphur density as a concentration (in parts-per-million) and the vertical axis gives the relative lifespan (as a percentage). The sulphur density was computed by first using secondary ion mass spectrometry (hereinafter, SIMS) to compute a weight of sulphur in each layer of the organic EL element 1. The mass ratio of sulphur to sodium in the electron injection layer 6 is then computed and converted into a numerical ratio of sulphur atoms to sodium atoms.

As shown in FIG. 5, the relative lifespan increases as the sulphur density grows. Noting the sulphur density at which the relative lifespan dramatically decreases, the necessary sulphur density in the electron injection layer 6 is such that the sulphur is present in the electron injection layer 6 at a concentration of no less than 96 ppm.

(Sulphur Density Upper Bound)

As it happens, when the sulphur density in the electron injection layer 6 is greater than a predetermined value, the excitation activity produced by the recombination of electrons and holes in the light-emitting layer 5 becomes prone to loss, thus likely deteriorating the light-emitting efficiency of the light-emitting layer 5. As such, there exists not only the aforementioned lower limit, but also an upper limit on the sulphur density.

Figure 6:
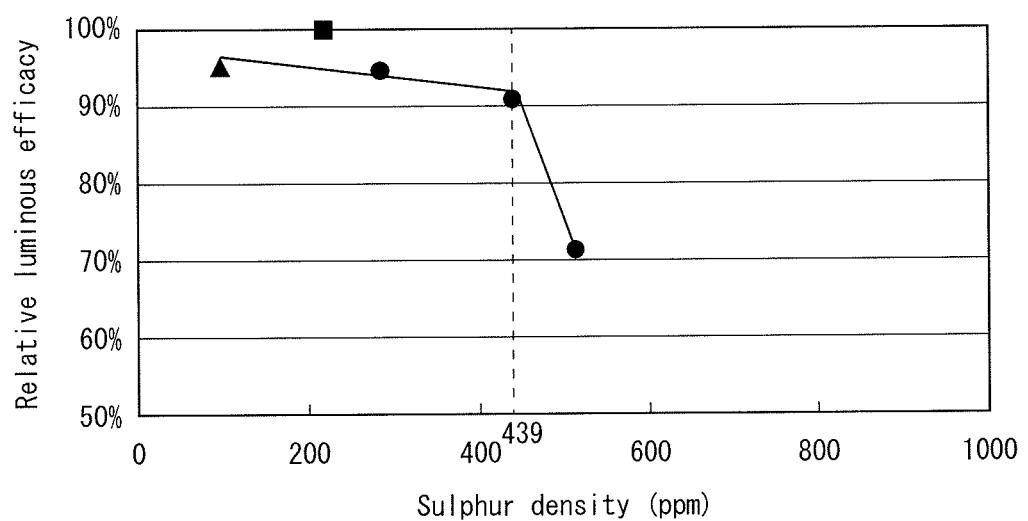
FIG. 6 is a graph representing the relationship between sulphur density and relative luminous efficacy.

FIG. 6 indicates the relationship between the sulphur density and the relative luminous efficacy of the electron injection layer 6. Here, the horizontal axis gives the sulphur density as a concentration (in parts-per-million) and the vertical axis gives the relative luminous efficacy (as a percentage). The sulphur density was computed by first using SIMS to compute a ratio of sulphur atoms to sodium atoms, converted from the mass ratio of sulphur to sodium.

As shown in FIG. 6, the light-emitting efficacy decreases as the sulphur density grows. Noting the sulphur density at which the light-emitting efficacy dramatically decreases, the necessary sulphur density in the electron injection layer 6 is a concentration of no more than 439 ppm.

(Results and Application to Hole Injection Layer 3)

According to the above, a sulphur density in terms of the proportion of sulphur to metal in the electron injection layer that is a concentration of no less than 96 ppm and no more than 439 ppm serves to constrain the deterioration of the light-emitting layer 5. These findings are applicable not only to the electron injection layer 6 but also to the hole injection layer 3. That is, a sulphur concentration in terms of the proportion of sulphur to metal in the hole injection layer 3 that is no less than 96 ppm and no more than 439 ppm serves to constrain the deterioration of the light-emitting layer 5.

5. Effects

The organic EL element 1 has the hole injection layer 3 including sulphur atoms and formed between the anode 2 and the light-emitting layer 5, and thus constrains the degradation of the light-emitting layer 5 caused by water infiltration. Also, the electron injection layer 6 including sulphur atoms is formed between the cathode 7 and the light-emitting layer 5, thus reliably constraining the deterioration of the light-emitting layer 5 caused by infiltrating water. The sulphur concentration in the hole injection layer 3 is greater than the sulphur concentration in the electron injection layer 6. Accordingly, the approach of water from the planarizing layer 11 to the light-emitting layer 5 is effectively constrained. According to the above, the lifespan and light-emitting properties of the organic EL element 1 are reliably controlled.

In the organic EL element 1, the hole injection layer 3 having the sulphur atoms is formed between the anode 2 and the light-emitting layer 5, while the electron injection layer 6 having the sulphur atoms is formed between the cathode 7 and the light-emitting layer 5. However, no such limitation is intended. The effects may also be realised using another configuration in which the hole injection layer 3 having the sulphur atoms is provided between the anode 2 and the light-emitting layer 5.

(Variations)

The organic EL element pertaining to the present invention is not limited to being configured as a single element. The configuration is also applicable to an organic EL element device made up of a plurality of organic EL elements serving as pixels collected on a substrate. Such an organic EL device is realisable by appropriately adjusting the thickness of the layers in each element, to be used in a lighting apparatus for instance.

1. Organic EL Element Layer Configuration

The organic EL element pertaining to the present invention is not limited to realisation as a top-emission element, but may also be configured as a bottom-emission element.

2. Hole Injection Layer 3 Material

In the above-described Embodiment, the hole injection layer has a configuration that uses WO However, no such limitation is intended. The hole injection layer is not limited to $WO_x$, but may be configured using any transition metal oxide. The transition metals include tungsten (W), molybdenum (Mo), vanadium (V), and so on. Also, no limitation to oxides is intended. The configuration may also use the transition metal in simple form.

In such a case, the sulphur density in the hole injection layer is calculated by taking the mass ratio of sulphur to the transition metal and converting this to a numerical ratio of sulphur atoms to atoms of the transition metal. The sulphur density in terms of the ratio of sulphur to the metal used in the hole injection layer is a concentration of no less than 96 ppm and no more than 439 ppm.

Also, the hole injection layer is not limited to inorganic material but may also be made of an organic material, such as PEDOT:PSS (poly(3,4-ethylene dioxythiophene)-poly-(styrene sulfonate)).

3. Electron Injection Layer 3 Material

In the above-described Embodiment, the electron injection layer has a configuration that uses NaF. However, no such limitation is intended. The electron injection layer is not limited to NaF, but may also use any configuration including an alkali metal fluoride or an alkali earth metal fluoride. The alkali metals include lithium (Li), sodium, potassium (K), rubidium (Rb), cesium (Cs), and francium (Fr). Likewise, the alkali earth metals include beryllium (Br), magnesium (Mg), calcium (Ca), strontium (Sr), barium (Ba), and radium (Ra). Also, the electron injection layer is not limited to using a fluoride, but may also be configured with the alkali metal or alkali earth metal in pure form.

Here, the sulphur density within the electron injection layer is calculated by taking the mass ratio of sulphur to the alkali metal or to the alkali earth metal, and converting this to a numerical ratio of sulphur atoms to atoms of the alkali metal or the alkali earth metal. The sulphur density in the electron injection layer is beneficially a concentration of no less than 96 ppm and no more than 439 ppm.

4. Organic EL Element Application Example

The organic EL element pertaining to the present invention is applicable to an organic EL panel. Application to the organic EL panel realises an organic EL panel with excellent light-emitting properties.

Figure 7:
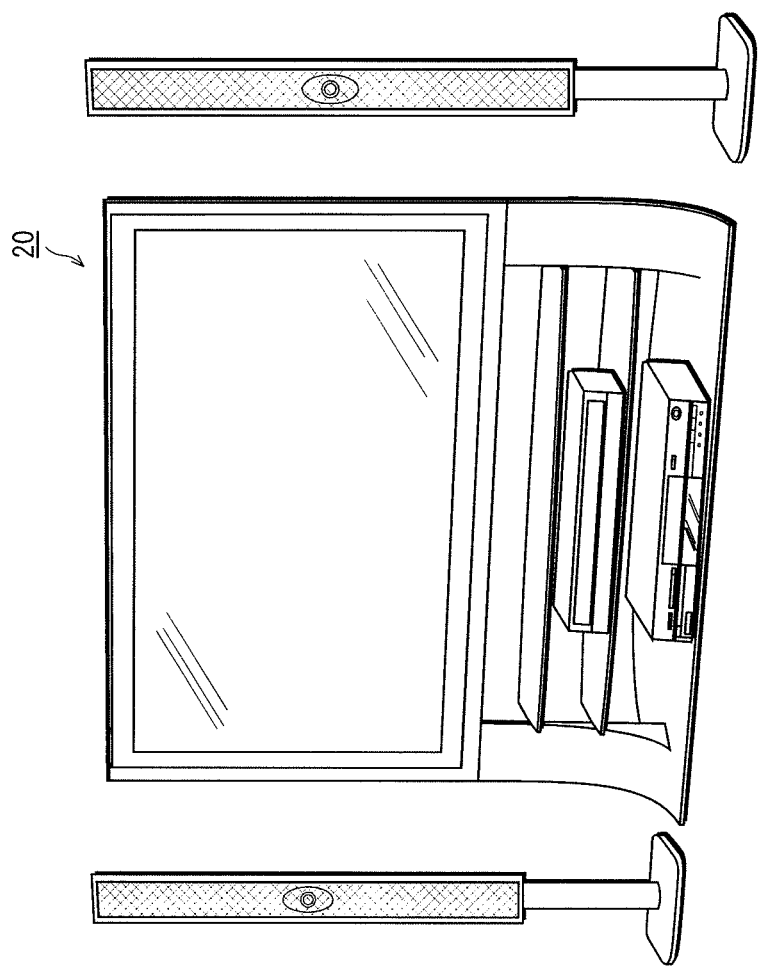
FIG. 7 is a perspective view diagram of a display panel incorporating the organic EL element 1 illustrated in FIG. 1.

The aforementioned organic EL display panel is applicable to sale and distribution as a standalone device. However, no such limitation is intended. As shown in FIG. 7, an organic EL panel incorporating the organic EL element pertaining to the present invention may also be distributed in combination with a light-emitting device, as a digital television or the like.

The organic EL panel may include one organic EL element, or may include a plurality of organic EL elements of a single colour or of red, green, and blue colours corresponding to pixels.

The organic EL element pertaining to the present invention is also applicable to an organic EL light-emitting device or to an organic EL display device. The organic EL light-emitting device is, for example, used in a lighting apparatus or the like.

The organic EL display panel is, for example, applicable to use as an organic EL display device or the like.

5. Other

Although not specifically described above, the organic EL element may also be provided with a sealing member or have a getter solution applied thereto.

[Industrial Applicability]

The organic EL element of the present disclosure is applicable to, for example, public and private facilities, as well as to industrial display devices, televisions, mobile electronic device displays, and other items benefitting from an organic EL device.

REFERENCE SIGNS LIST

1 Organic EL element
2 Anode
3, 13 Hole injection layer
4 Hole transport layer
5 Light-emitting layer
6, 16 Electron injection layer
7 Cathode
8 Partition layer
10 Substrate
11 Planarising layer
12 DC power source

The invention claimed is:

1. An organic electroluminescence element, comprising:
   a first electrode and a second electrode;
   a light-emitting layer containing an organic material and provided between the first electrode and the second electrode; and
   a first functional layer provided between the first electrode and the light-emitting layer, wherein
   the first functional layer includes metal atoms and sulphur atoms,
   the first functional layer has a sulphur concentration such that a proportion of the sulphur atoms relative to the metal atoms in the first functional layer is no less than 96 ppm and no more than 439 ppm, and
   the first functional layer is a hole injection layer.

2. The organic electroluminescence element of claim 1, further comprising
   a second functional layer provided between the second electrode and the light-emitting layer, wherein
   the second functional layer includes metal atoms and sulphur atoms, and
   the second functional layer has a sulphur concentration such that a proportion of the sulphur atoms to the metal atoms in the second functional layer is no less than 96 ppm and no more than 439 ppm.

3. The organic electroluminescence element of claim 2, wherein
   the first electrode is an anode,
   the second electrode is a cathode,
   the first functional layer includes the metal atoms as W in a metal oxide $WO_x$, and
   the second functional layer includes the metal atoms as Na in a metal fluoride NaF.

4. The organic electroluminescence element of claim 2, wherein
   the first functional layer has a greater sulphur concentration than the second functional layer.

5. The organic electroluminescence element of claim 4, wherein a planarizing layer made of a resin material is provided on an opposite side of the first electrode with respect to the first functional layer.

6. An organic electroluminescence panel comprising organic electroluminescence element of claim 1, provided in plurality.

7. An organic electroluminescence light-emitting device, comprising:
   organic electroluminescence element of claim 1; and
   a circuit driving the organic electroluminescence element.

8. An organic electroluminescence display device, comprising:
   the organic electroluminescence element of claim 1; and
   a circuit driving the organic electroluminescence element.

9. The organic electroluminescence element of claim 1, wherein
   the first functional layer includes a hole injection material.

10. The organic electroluminescence element of claim 9, wherein
    the hole injection material is an oxide of a transition metal.

11. The organic electroluminescence element of claim 10, wherein
    the oxide of the transition metal is tungsten oxide $WO_x$.

12. The organic electroluminescence element of claim 11, wherein
    the coefficient x of the tungsten oxide $WO_x$ is a real number greater than 0.5 and less than 2.

13. The organic electroluminescence element of claim 9, wherein
    the hole injection material is configured to transfer holes from the first electrode to the first functional layer.

14. The organic electroluminescence element of claim 1, wherein
    the first functional layer and the second electrode are equal in thickness.

15. The organic electroluminescence element of claim 2, wherein
    the first functional layer and the second functional layer are equal in thickness.

16. An organic electroluminescence element, comprising:
    a first electrode, the first electrode being an anode;
    a second electrode, the second electrode being a cathode;
    a light-emitting layer containing an organic material and provided between the first electrode and the second electrode;
    a first functional layer provided between the first electrode and the light-emitting layer; and
    a second functional layer provided between the second electrode and the light-emitting layer, wherein
    each of the first functional layer and the second functional layer includes metal atoms and sulphur atoms,
    the first functional layer has a sulphur concentration such that a proportion of the sulphur atoms relative to the metal atoms in the first functional layer is no less than 96 ppm and no more than 439 ppm,
    the second functional layer has a sulphur concentration such that a proportion of the sulphur atoms to the metal atoms in the second functional layer is no less than 96 ppm and no more than 439 ppm,
    the first functional layer includes the metal atoms as W in a metal oxide $WO_x$, and
    the second functional layer includes the metal atoms as Na in a metal fluoride NaF.

\* \* \* \* \*